(12) United States Patent
Hwang et al.

(10) Patent No.: US 11,264,538 B2
(45) Date of Patent: Mar. 1, 2022

(54) NEAR-ULTRAVIOLET LIGHT-EMITTING SEMICONDUCTOR LIGHT-EMITTING ELEMENT AND GROUP III NITRIDE SEMICONDUCTOR TEMPLATE USED THEREFOR

(71) Applicant: Soft-Epi Inc., Gyeonggi-do (KR)

(72) Inventors: Sung Min Hwang, Gyeonggi-do (KR); In Sung Cho, Gyeonggi-do (KR); Won Taeg Lim, Gyeonggi-do (KR); Doo Soo Kim, Gyeonggi-do (KR)

(73) Assignee: Soft-Epi Inc., Gyeonggi-Do (KR)

( * ) Notice: Subject to any disclaimer, the term of this patent is extended or adjusted under 35 U.S.C. 154(b) by 0 days.

(21) Appl. No.: 16/234,933

(22) Filed: Dec. 28, 2018

(65) Prior Publication Data

US 2019/0140140 A1 May 9, 2019

Related U.S. Application Data

(63) Continuation of application No. 16/083,618, filed as application No. PCT/KR2017/001471 on Feb. 10, 2017, now abandoned.

(30) Foreign Application Priority Data

Mar. 10, 2016 (KR) ........................ 10-2016-0028850

(51) Int. Cl.
*H01L 33/22* (2010.01)
*H01L 33/32* (2010.01)
(Continued)

(52) U.S. Cl.
CPC ............ *H01L 33/22* (2013.01); *H01L 33/007* (2013.01); *H01L 33/12* (2013.01); *H01L 33/20* (2013.01);
(Continued)

(58) Field of Classification Search
None
See application file for complete search history.

(56) References Cited

U.S. PATENT DOCUMENTS

| 5,290,393 A | 3/1994 | Nakamura |
| 7,759,140 B2 | 7/2010 | Lee et al. |

(Continued)

FOREIGN PATENT DOCUMENTS

| JP | 2003-218396 A | 7/2003 |
| JP | 2011-187591 A | 9/2011 |

(Continued)

OTHER PUBLICATIONS

International Search Report from corresponding PCT Application No. PCT/KR2017/001471 dated May 17, 2018, with an English translation.

*Primary Examiner* — Alexander G Ghyka
(74) *Attorney, Agent, or Firm* — Harness, Dickey & Pierce, P.L.C.

(57) ABSTRACT

Disclosed is a Group III nitride semiconductor template for a 300-400 nm near-ultraviolet light emitting semiconductor device, the template including: a growth substrate; a nucleation layer based on $Al_xGa_{1-x}N$ (0<x≤1, x>y); and a monocrystalline Group III nitride semiconductor layer based on $Al_yGa_{1-y}N$ (y>0), and a near-ultraviolet light emitting semiconductor device using the template.

5 Claims, 8 Drawing Sheets

(51) Int. Cl.
  *H01L 33/12* (2010.01)
  *H01L 33/00* (2010.01)
  *H01L 33/20* (2010.01)
  *H01L 33/06* (2010.01)

(52) U.S. Cl.
  CPC .............. *H01L 33/32* (2013.01); *H01L 33/06* (2013.01); *H01L 2933/0091* (2013.01)

(56) References Cited

U.S. PATENT DOCUMENTS

| | | |
|---|---|---|
| 7,759,246 B2 | 7/2010 | Matsuki et al. |
| 2003/0006409 A1 | 1/2003 | Ohba |
| 2005/0087124 A1* | 4/2005 | Dwilinski ................ C30B 7/00 117/89 |
| 2020/0058827 A1* | 2/2020 | Hwang .................. H01L 33/22 |

FOREIGN PATENT DOCUMENTS

| | | |
|---|---|---|
| KR | 10-2013-0074080 A | 7/2013 |
| KR | 10-2014-0020028 A | 2/2014 |

* cited by examiner

ND GROUP III NITRIDE
NEAR-ULTRAVIOLET LIGHT-EMITTING SEMICONDUCTOR LIGHT-EMITTING ELEMENT AND GROUP III NITRIDE SEMICONDUCTOR TEMPLATE USED THEREFOR

CROSS-REFERENCE TO RELATED APPLICATIONS

This application is a continuation application of U.S. application Ser. No. 16/083,618, filed on 10 Sep. 2018, which is a national phase application of PCT Application No. PCT/KR2017/001471, filed on 10 Feb. 2017, which claims the benefit and priority to Korean Patent Application No. 10-2016-0028850 filed on 10 Mar. 2016. The entire disclosures of the applications identified in this paragraph are incorporated herein by references.

FIELD

The present disclosure relates generally to a near-ultraviolet (UV) light emitting semiconductor device and a Group III nitride semiconductor template used therefor. More particularly, it relates to a near-ultraviolet light emitting semiconductor device using AlGaN, and a Group III nitride semiconductor template used therefor. In the context herein, the term "semiconductor light emitting device" is intended to indicate a semiconductor optoelectronic device which generates light by electron-hole recombination. One example thereof is a Group III-nitride semiconductor light emitting device, in which the Group III-nitride semiconductor includes a compound containing Al(x)Ga(y)In(1-x-y)N ($0 \le x \le 1$, $0 \le y \le 1$, $0 \le x+y \le 1$) and may also contain impurities such as Si, Mg, etc.

BACKGROUND

This section provides background information related to the present disclosure which is not necessarily prior art.

FIG. 1 is a diagrammatic representation illustrating a method for growing a Group III nitride semiconductor layer described in U.S. Pat. No. 5,290,393. According to the method, a $Al_xGa_{1-x}N$ ($x \ge 0$) nucleation layer 20 followed by a Group III nitride, $Al_yGa_{1-y}N$ ($y \ge 0$), semiconductor layer 21 are grown on a growth substrate 10. For example, a GaN nucleation layer 20 is formed at a temperature of 500° C., and a Group III nitride, GaN semiconductor layer 21 is next formed at a temperature of 1020° C. Although other exemplary methods of growing an Al-based nucleation layer 20 and an Al-based Group III nitride semiconductor layer 21 are also described in the document, there are still technical limitations to apply those disclosed methods to grow such an Al-based Group III nitride semiconductor layer 21 in any actually commercially available Group III nitride semiconductor light emitting device (e.g. LED, LD, etc.).

FIG. 2 illustrates a Group III nitride semiconductor light emitting device described in U.S. Pat. No. 7,759,140, in which the semiconductor light emitting device includes a growth substrate 10, a nucleation layer (not shown), an n-type Group III nitride semiconductor layer 30 (e.g. Si-doped GN), an active layer 40 (e.g. InGaN/(In)/GaN multiple quantum well structure) for generating light by electron-hole recombination, a p-type Group III nitride semiconductor layer 50 (e.g. Mg-doped GaN), a p-side electrode 70, and an n-side electrode 80. The nucleation layer, the n-type Group III nitride semiconductor layer 30, and the p-type Group III nitride semiconductor layer 50 are based on GaN. The growth substrate 10 (e.g. a C-plane sapphire substrate) has uneven (protruded and depressed) portions 11 for scattering light, and this type of growth substrate is called a PSS (Patterned Sapphire Substrate).

Group III nitride semiconductor light emitting devices have been used mainly for blue or green light emission, but it is now noted for near-ultraviolet light emission. Ultraviolet light can be categorized into three basic ranges: UVA from 315 to 400 nm, UVB from 280 to 315 nm, and UVC from 100 to 280 nm. In the present disclosure, the UV region from 300 to 400 will be the main target.

Despite the recent technical trend, there are technical difficulties to apply the epitaxial structure of the conventional blue light emitting Group III nitride semiconductor device to a near-ultraviolet light emitting Group III nitride semiconductor device. For example, in case of near-ultraviolet light of 365 nm, a portion of the light can be absorbed by GaN (band gap energy: 3.4 eV).

This problem could be resolved by minimizing the content of GaN during the manufacture of a near-ultraviolet light emitting Group III nitride semiconductor device. Nevertheless, as discussed earlier in relation to FIG. 1, it is generally hard to grow a high-quality, Al-based Group III nitride semiconductor layer 21 on the side of the growth substrate 10. In the related art, a high-quality, GaN-based Group III nitride semiconductor layer 21 is grown on the side abutting against the growth substrate 10, and subsequently a near-ultraviolet light emitting Group III nitride semiconductor structure is grown on the semiconductor layer 21. Later, the growth substrate 10 and the GaN-based Group III nitride semiconductor layer 21 are removed. This type of semiconductor light emitting device with the growth substrate 10 removed is called a vertical chip.

U.S. Pat. No. 7,759,246 also mentioned that it is not easy to grow a high-quality Al-based layer on the growth substrate by pointing out that the growth speed gets slower by an increase in the Al content, and a layer with a higher Al content is under more stress (e.g. a thick AlGaN layer is likely subject to cracking). To address this issue, an ultraviolet light emitting epitaxial structure is grown on a GaN-based layer, which is later used as a sacrificial layer and removed together with the growth substrate.

SUMMARY

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a Group III nitride semiconductor template for a 300-400 nm near-ultraviolet light emitting semiconductor device, the template including: a growth substrate; a nucleation layer based on $Al_xGa_{1-x}N$ ($0<x \le 1$, $x>y$); and a monocrystalline Group III nitride semiconductor layer based on $Al_yGa_{1-y}N$ ($y>0$).

According to another aspect of the present disclosure, there is provided a 300-400 nm near-ultraviolet light emitting semiconductor device, including: a growth substrate; a nucleation layer based on $Al_xGa_{1-x}N$ ($0<x \le 1$, $x>y$); a monocrystalline Group III nitride semiconductor layer based on $Al_yGa_{1-y}N$ (y>0); a light emitting structure arranged above the Group III nitride semiconductor layer, for emitting near-ultraviolet light through electron-hole recombination; and a first and a second electrodes supplying electrons and holes to the light emitting structure, in which Al composition value y in the Group III nitride semiconductor layer is determined, so as to prevent the Group III nitride semiconductor layer from absorbing the near-ultraviolet light emitted from the light emitting structure.

Advantageous Effects

The advantageous effects of the present disclosure will be described in the latter part of the best mode for carrying out the invention.

DETAILED DESCRIPTION

Figure 1:
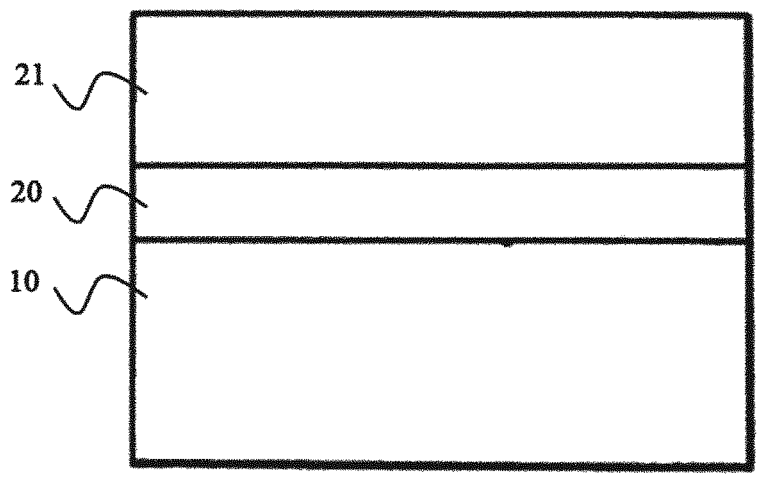
FIG. 1 is a diagrammatic representation illustrating a method for growing a Group III nitride semiconductor layer described in U.S. Pat. No. 5,290,393.
Figure 2:
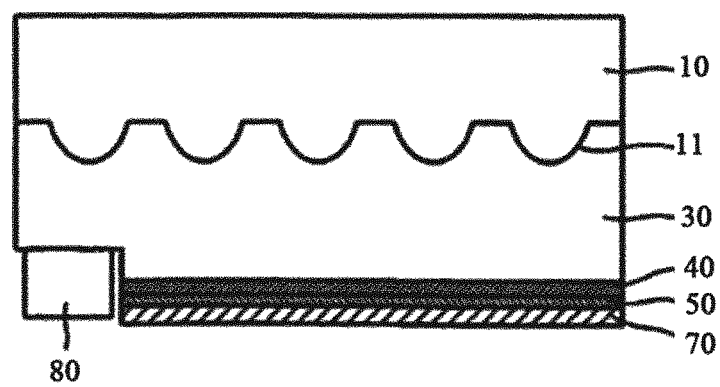
FIG. 2 illustrates a Group III nitride semiconductor light emitting device described in U.S. Pat. No. 7,759,140.
Figure 3:
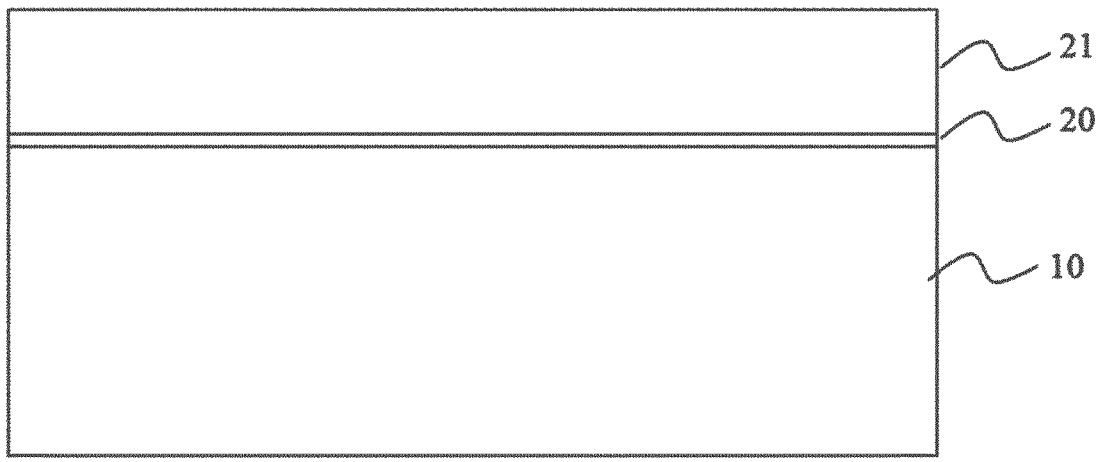
FIG. 3 illustrates an exemplary embodiment of a Group III nitride semiconductor template according to the present disclosure.

FIG. 3 illustrates an exemplary embodiment of a Group III nitride semiconductor template according to the present disclosure, in which the template includes a growth substrate 10, a nucleation layer 20, and a Group III nitride semiconductor layer 21. The present disclosure will now be described in detail with reference to the accompanying drawing(s). The detailed description herein is presented for purposes of illustration only and not of limitation.

The growth substrate 10 is generally formed of a material different from the Group III nitride semiconductor layer 21. For example, it can be a sapphire ($Al_2O_3$) substrate, and the nucleation layer 20 and the Group III nitride semiconductor layer 21 are usually grown on the C plane of the sapphire substrate.

The nucleation layer 20 is introduced for crystal growth of the Group III nitride semiconductor layer 21 on the growth substrate 10 based on a hetero-material. It can be formed of $Al_xGa_{1-x}N$ (0<x≤1) for example, and grown at a temperature lower than the growth temperature of the Group III nitride semiconductor layer 21 in general. A higher Al content may reduce absorption of light generated by the active layer. In this regard, AlN would be most recommended.

The Group III nitride semiconductor layer is formed of $Al_yGa_{1-y}N$ (y>0), and preferably has a band gap energy range for not absorbing the light emitted from a light emitting structure to be grown on its top. For instance, in case of 365 nm near-ultraviolet light emission, the Group III nitride semiconductor layer may be formed of $Al_{0.05}Ga_{0.95}N$. Although the band gap energy increases by a higher Al content, the crystallinity of the Group III nitride semiconductor layer 21 is adversely affected by such a high Al content, as mentioned above. Therefore, the content of Al should preferably be determined in a way that the Group III nitride semiconductor layer 21 would not absorb the light being emitted and at the same time, its crystallinity may be minimally impaired. Although the Group III nitride semiconductor layer 21 may contain a dopant (e.g. Si, Mg or the like) or In as its components, it is not recommended for the crystallinity.

Figure 4:
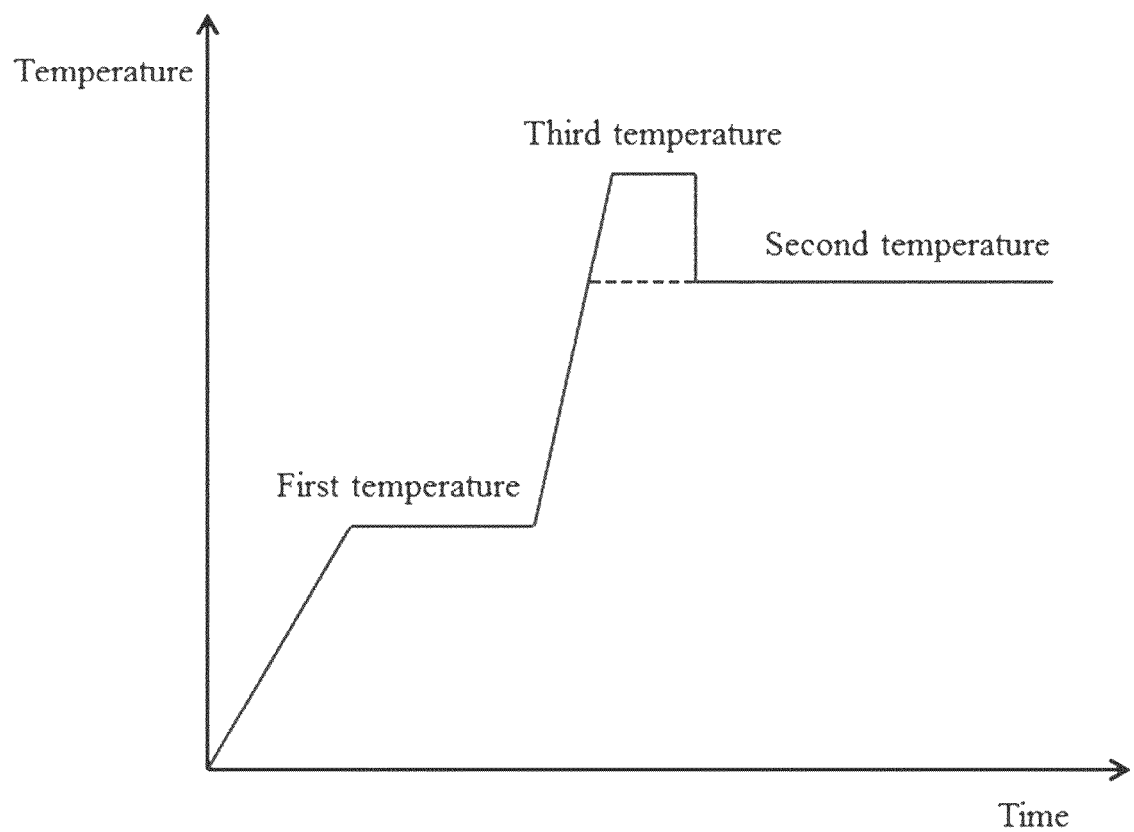
FIG. 4 is a diagrammatic representation illustrating a method for manufacturing a Group III nitride semiconductor template according to the present disclosure.

FIG. 4 is a diagrammatic representation illustrating a method for manufacturing a Group III nitride semiconductor template according to the present disclosure. First, the growth substrate 10 undergoes a typical pretreatment such as cleansing, and a nucleation layer 20 is then grown thereon at a first temperature. Subsequently, the Group III nitride semiconductor layer 21 is grown at a second temperature that is higher than the first temperature. Preferably, before the growth of the Group III nitride semiconductor layer 21 takes place, the nucleation layer 20 is crystallized at a third temperature that is higher than the first temperature and lower than the second temperature. In general, the nucleation layer 20 and the Group III nitride semiconductor layer 21 are grown by means of a MOCVD system.

The growth of the nucleation layer 20 takes place at a low temperature (first temperature) where thermos-dynamical effects on molecular elements of the nucleation layer 20 (i.e., Al, N, Ga) are minimal while gas flow in the physical source injection and reactor of an epitaxial growth system (e.g. MOCVD system) has a stronger influence on the growth. In other words, a uniform physical deposition can be realized on the growth substrate 10 if the reactor is tuned at a low temperature zone with a high degree of uniformity for source deposition. The $Al_xGa_{1-x}N$ (0<x≤1) nucleation layer 20 grown at the low, first temperature is a polycrystalline film based on a mixture of AlN and GaN, and their combination ratio can be adjusted to the composition ratio of Al in the Group III nitride semiconductor layer 21 to be grown on the nucleation layer 20. This is done so that a lattice constant of the nucleation layer 20 conforms to the lattice constant of the Group III nitride semiconductor layer 21. However, this conformity of lattice constants is not necessarily advantageous for the crystallinity of the Group III nitride semiconductor layer 21 because the nucleation layer 20 is polycrystalline. On the other hand, the crystal growth mode can be modified by varying the combination ratio of AlN and GaN. That is, if the content of AlN is higher it is modified to '3D-like crystal growth mode, and if the content of GaN is higher, it is modified to the '2D-like crystal growth mode'. Therefore, with adjustment of the combination ratio, the Group III nitride semiconductor layer 21 may have an optimized quality of crystals.

Once grown, the nucleation layer 20, which is a polycrystalline film, is usually crystallized while it is being warmed up to and/or has reached to the growth temperature (second temperature) of the Group III nitride semiconductor layer 21. During this process, it is possible to change the crystal growth mode of the nucleation layer 20. According to the present disclosure, the nucleation layer 20 grown is crystallized while it is being warmed up to and/or has reached to a temperature (third temperature) higher than the second temperature. In this way, not only the nucleation layer 20 can be crystallized, but the Group III nitride semiconductor layer 21 may have an additionally improved crystallinity. While the third temperature higher than the second temperature has been used for crystallization of the nucleation layer 20, the second temperature is still suitable for crystal growth of the Group III nitride semiconductor layer 21 that is a monocrystalline film. For the nucleation layer 20 to be crystallized at the third temperature (i.e. for the nucleation layer 20 to maintain thermo-dynamical stability at the third temperature), it is preferably formed of materials that are thermodynamically stable at around the third temperature. In case of Al—Ga—N based materials as main component layers of the present disclosure, they preferably should have a high Al composition ratio therein. For example, if the Group III nitride semiconductor layer 21 is formed of $Al_{0.05}Ga_{0.95}N$, it is desirable that the nucleation layer 20 based on $Al_xGa_{1-x}N$ ($0<x\leq1$) has the x value greater than 0.05. In this regard, if the nucleation layer 20 is formed of AlN (x=1), the third temperature can have the highest possible process upper limit.

The nucleation layer 20 is re-crystallized at the third temperature and provides a structure that would minimize the density of defective crystals due to the non-conformity of lattice constants during the growth at the second temperature. In order to satisfy these two technical issues, a suitable composition ratio of Al is required. Namely, the x value in $Al_xGa_{1-x}N$ ($0<x\leq1$) should preferably be at least 0.5. In other words, if the x value is approximate to 1, the thermo-dynamical stability of the nucleation layer 20 at the third temperature is increased, and a 3D island growth mode is activated, creating conditions for a lateral growth mode, i.e. in parallel to the surface of the growth substrate 10 during the growth at the second temperature. However, if the composition ratio of Al is too high, 3D island density gets also increased such that sufficient coalescing may not take place on the growth surface during the growth at the second temperature and it can be very difficult to obtain a smooth growth surface. These account for the need of a suitable Al composition ratio ($0.5\leq x\leq1$).

Besides the Al composition ratio, thickness is another important process parameter for the nucleation layer 20. The thickness of the nucleation layer 20 growing at the first temperature is crucial for determining height of SD islands to be formed at the third temperature. A preferable empirical range of the thickness is between 10 and 100 nm. If the thickness is too small, the height of 3D islands will not be sufficient to give rise to good effects; if the thickness is too great, the 3D islands thus formed will be too high to produce a sufficiently smooth, even surface.

Accordingly, the nucleation layer 20 preferably has a thickness ranging from 10 to 100 nm, the Al composition ratio between 50 and 100%, and the growth temperature ranging from 400 to 600° C. prevailing in surface kinetics limited conditions. Meanwhile, growth pressure is generally not a crucial process parameter in the formation of the nucleation layer 20. Typically, the nucleation layer 20 can be grown at various pressures ranging from 100 to 760 torr. In addition, MO source or carrier gas flow may be determined according to optimal MOCVD conditions to be used.

The third temperature is preferably higher than the second temperature by 10 to 300° C. Since the second temperature is usually between 1000 and 1100° C., the third temperature will be between 1010 and 1400° C. The range of an optimal temperature varies by the thickness and Al composition ratio of the nucleation layer 20. As the thickness and Al composition rate are increased, the optimal temperature is set higher. Depending on the third temperature, shape and size of the 3D islands are determined. If it is set too high, thermos-dynamical stability on the nucleation layer 20 will be deteriorated, causing surface desorption. The shape and size of the 3D islands are also affected by duration of the third temperature and an amount of time required for elevating the first temperature to the third temperature. Since optimization of these parameters is subject to commonly used conditions of the reactor (MO source, V/III ratio, pressure of the reactor, etc.), it is desirable to modify them accordingly, instead of giving fixed values for all.

The Al composition ratio or value in the Group III nitride semiconductor layer 21 based on $Al_yGa_{1-y}N$ ($y>0$) is preferably smaller than the Al composition ratio x in the nucleation layer 20 based on $Al_xGa_{1-x}N$ ($0<x\leq1$). In that way, 3D islands that are formed from the nucleation layer 20 going through the process in the third temperature range will produce a smooth epitaxial layer when the growth mode is turned into the 2D growth mode for the Group III nitride semiconductor layer 21 in the second temperature range. In general, the 2D growth mode becomes dominant as the Al composition ratio is small. Therefore, for an ultimate device design, the Group III nitride semiconductor layer 21 should preferably have the smallest possible Al composition ratio, yet its largest Al composition ratio should preferably be smaller than the Al composition ratio in the nucleation layer 20. This Group III nitride semiconductor layer 21 corresponds to a so-called buffer layer in the fabrication of a semiconductor device, and preferably has a thickness of 1 to 6 μm. If it is too thin, it may not be as effective as the buffer layer. Moreover, if it is too thick, due to the non-conformity of lattice constants between the growth substrate 10 and the Group III nitride semiconductor layer, more wafer bowing will be observed.

In an example, although there will be some differences in reactor pressure depending on MOCVD used, a relatively low pressure between 50 and 200 torr is normally used for the reactor during the growth of $Al_{0.05}Ga_{0.95}N$. This will increase the speed of carrier gas so that TMAl used may be prevented from actively getting involved in a parasitic reaction with $NH_3$ in atmospheric condition. The growth temperature used is typically in a range from 1000 to 1100° C., which is similar to the growth temperature of GaN or within a higher growth temperature zone by 10 to 50° C. In this way, surface mobility is enhanced and therefore, an Al precursor adsorbed on the growth surface can find its growth kink site better. The V/III ratio, which is a ratio between MO source flow and $NH_3$, varies by the type of a reactor used and the purpose of growth and therefore, it is preferably adapted to optimal conditions for each reactor. The Group III nitride semiconductor layer 21 is typically grown at a speed between 1 and 4 μm/h. In general, crystallinity is improved as the growth speed is slowed down, and vice versa. However, if the speed is too slow, growth efficiency is lowered.

Figure 5:
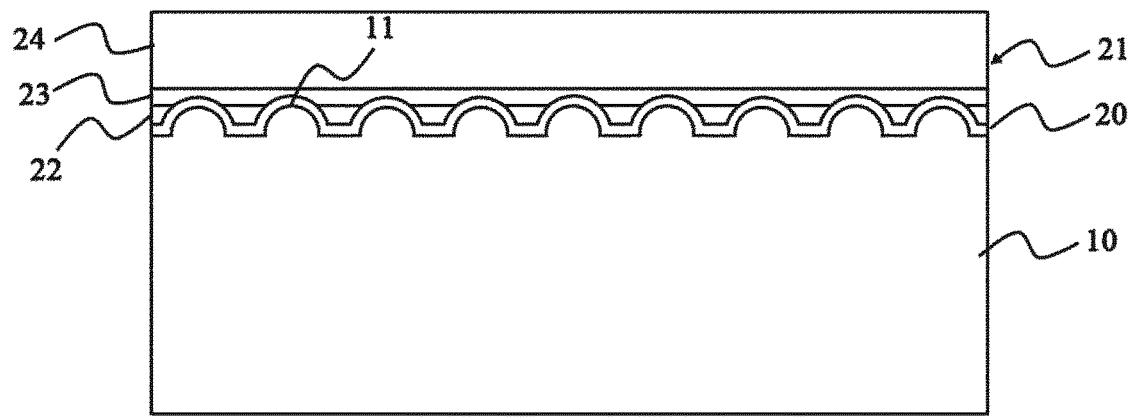
FIG. 5 illustrates another exemplary embodiment of a Group III nitride semiconductor template according to the present disclosure.

FIG. 5 illustrates another exemplary embodiment of a Group III nitride semiconductor template according to the present disclosure. The template includes a growth substrate 10, a nucleation layer 20, and a Group III nitride semiconductor layer 21. The growth substrate 10 has protruded and depressed portions 11 for scattering light. As shown, in the protruded and depressed portions 11, the protruded portion is formed of bumps created by etching the growth substrate 10 and the depressed portion is formed of an etch-exposed bottom surface of the growth substrate 10. Alternatively, the depressed portion may be formed by etching the growth substrate 10 and the protruded portion may be formed of the remaining, non-etched surface of the growth substrate 10. Further, a combination of these two is also applicable. In general, however, the protruded portion is preferably formed by etching the growth substrate 10.

The protruded portion 11 may be formed in a semi-spherical lens shape, for example, and have a width of 1.5 to 3 μm and a height of 1 to 2 μm.

Figure 6:
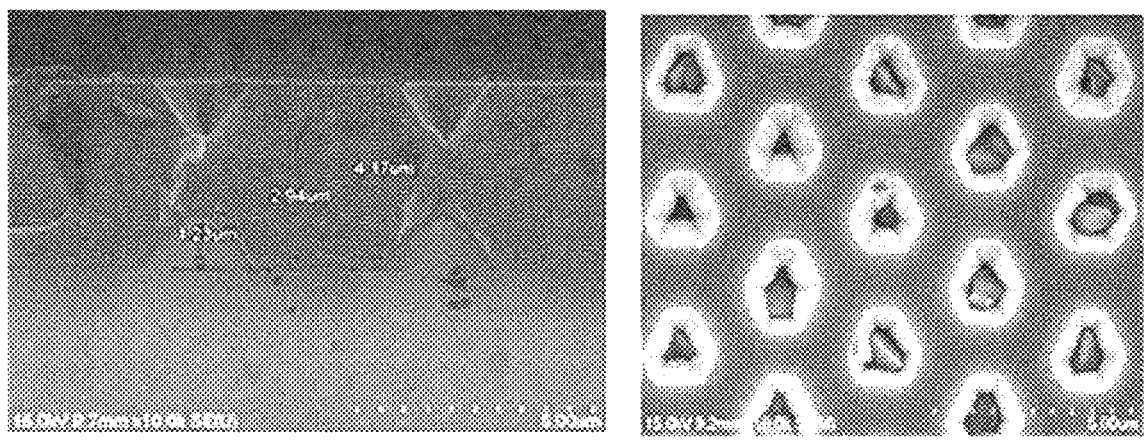
FIG. 6 is a photo showing crystal defects detected in the Group III nitride semiconductor layer, caused by unsuccessful growth on uneven (protruded and depressed) portions.

Compared with the template shown in FIG. 4, this template having protruded and depressed portions requires a higher level of technology for growing the Group III nitride semiconductor layer 21 based on $Al_yGa_{1-y}N$ (y>0) because it is not easy for the Group III nitride semiconductor layer 21 grown from the bottom surface of the growth substrate 10 to securely cover the protrude and depressed portions as well as coalesce each other. FIG. 6 illustrates an example of crystal defects detected in the Group III nitride semiconductor layer 21, caused by unsuccessful growth on the protruded and depressed portions.

The present disclosure addressed the problem mentioned above by dividing the Group III nitride semiconductor layer 21 into a first layer 22, a second layer 23 and a third layer 24. First, the nucleation layer 20 is formed and the first layer 22 is then grown under conditions that promote vertical growth. For instance, the first layer 22 is formed until it reaches to 80 to 90% of the height of the protruded portion. Next, the second layer 23 is grown under conditions that promote lateral growth for covering the protruded portion, and at the same time, the second layer 23 is encouraged to coalesce well. Lastly, the third layer 24 is formed under conditions that promote the formation of a flat layer, i.e., in 2D growth mode.

Figure 7:
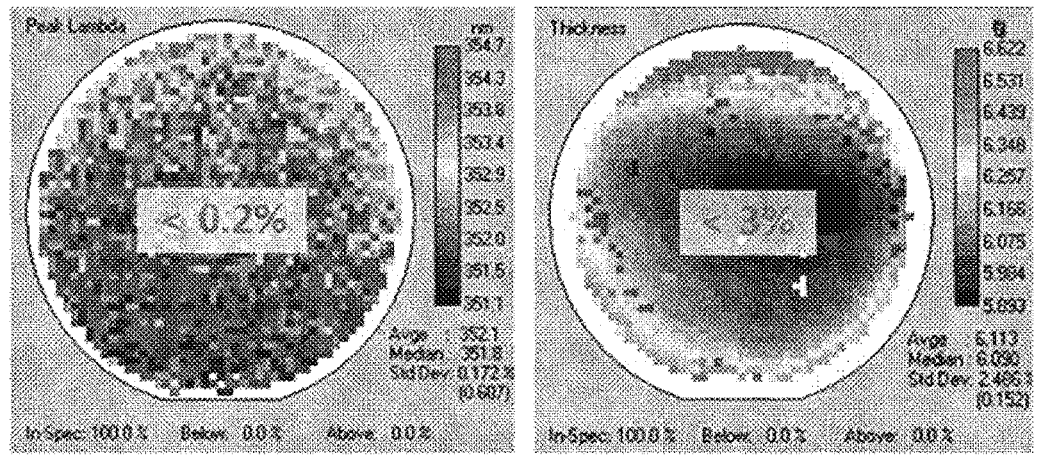
FIG. 7 shows test results on a Group III nitride semiconductor template that is manufactured according to the present disclosure.
Figure 7:
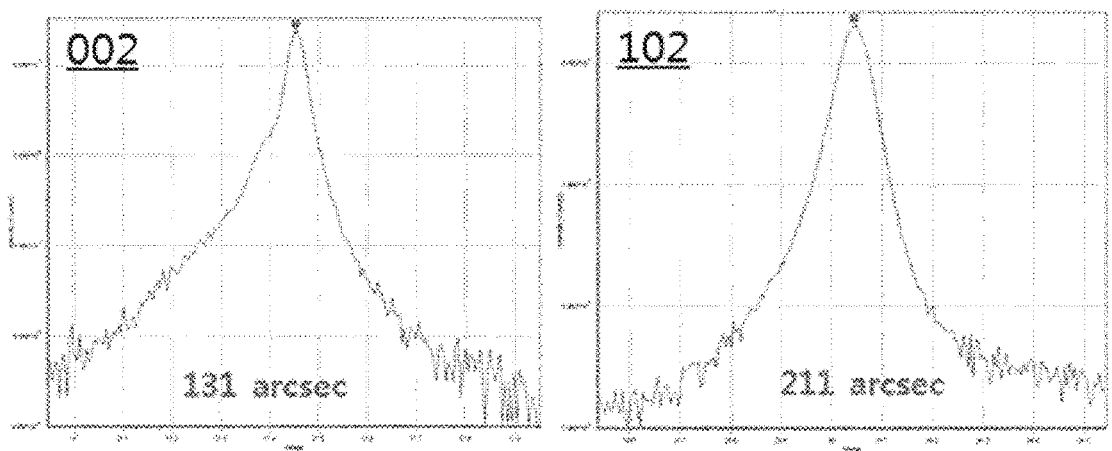

FIG. 7 shows test results on a Group III nitride semiconductor template that is manufactured according to the present disclosure. In the map of PL (photoluminescence) wavelength, an average value is 352 nm, meaning that the Al composition ratio in the Group III nitride semiconductor layer 21 is approximately 5%. Also, the wavelength uniformity is as good as 2% or lower. The template has an average thickness of 6 μm and its thickness uniformity is again as good as 3% or lower. XRD (X-ray diffraction) (002) and (102) of the template are 131 arcsec and 211 arcsec, respectively. The inventor(s) believe that, as far as they know, these are the best results for XRD crystallinity of the Group III nitride semiconductor layer 21 based on Al0.05Ga0.95N, as compared with those in all research papers and documents in peer-reviewed publications. Considering that 400 arcsec or less for XRD (102) is generally believed to be a good standard to manufacture commercial semiconductor light emitting devices, the above results are more than satisfactory, exceeding the standard.

The first layer 22 is a connecting layer to the nucleation layer 20 and a Group III metal-rich surface suitable for c-axis oriented growth. This is not far from the typical growth conditions of high-crystalline Group III nitride semiconductors, but the V/III ratio should preferably be greater than 500. The subsequently growing second layer 23 is a coalescing layer strongly under the 2D growth mode. In this layer, growth surfaces approaching each other in the lateral direction along the semi-spherical lens surface meet each other. Since different growth surfaces have different dangling bond structures thereon, there is still a need for finding optimal conditions for smooth connection. To this end, two useful methods can be tried: 1) a growth layer of a low-temperature zone for making the second layer less sensitive to crystal structure orientation of the growth surface, and 2) an ultimately reduced growth speed for allowing well-regularized coalesce. Preferably, this growth layer of a low-temperature zone is grown at a temperature lower than the third layer 24 by 20 to 100° C. and at a growth speed ranging from 0.1 to 1 μm/h. A valid parameter in the growth conditions for the second layer 23 is growth pressure. In general, a higher pressure is advantageous for smooth coalescing. However, if the pressure is so high, carrier gas speed gets slow down, a great deal of TMAl, a precursor of Al, is consumed in the parasitic reaction in atmospheric condition, making it difficult for efficient growth of AlGaN. As such, an optimal pressure of those two parameters becomes available. Once a smooth growth surface is created on the second layer 23, the third layer 24 can be grown under conventional growth conditions for the high-crystalline Group III nitride semiconductor layer.

Figure 8:
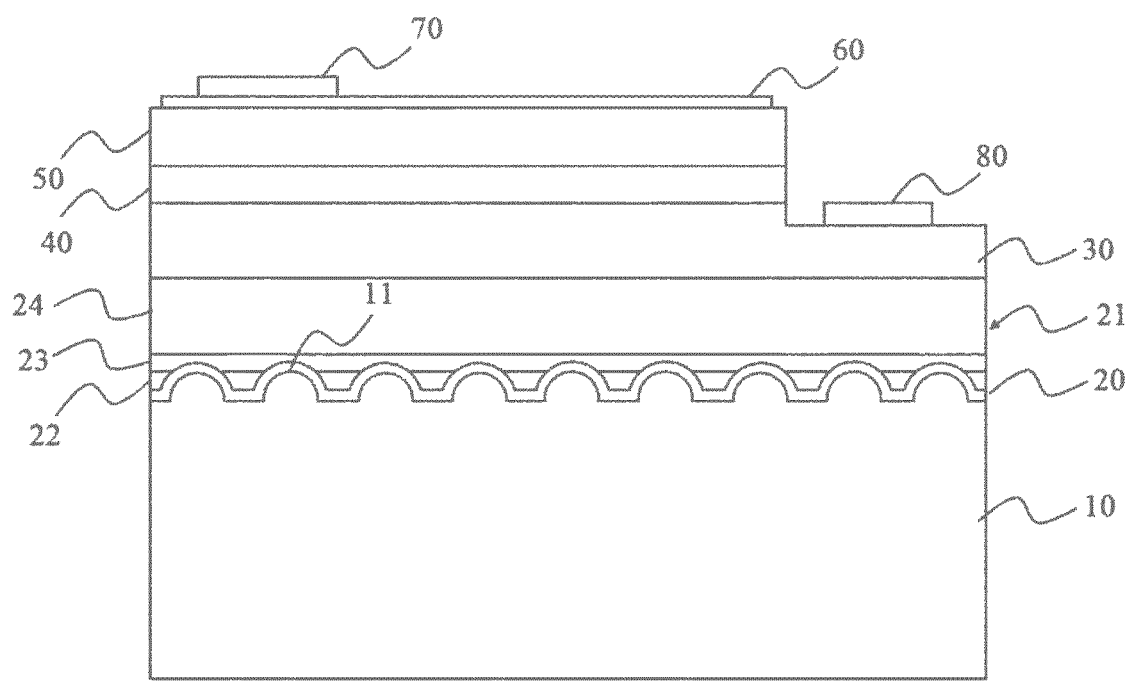
FIG. 8 illustrates an exemplary embodiment of a near-ultraviolet light emitting semiconductor device according to the present disclosure.

FIG. 8 illustrates an exemplary embodiment of a near-ultraviolet light emitting semiconductor device according to the present disclosure, in which the semiconductor light emitting device includes a growth substrate 10, a nucleation layer 20, a Group III nitride semiconductor layer 21, a first semiconductor layer having a first conductivity 30 (e.g. n-type AlGaN layer), an active layer 40 (e.g. InGaN multiple quantum well structure) for generating near-ultraviolet light by electron-hole recombination, a second semiconductor layer 50 (e.g. p-type AlGaN layer) having a second conductivity different from the first conductivity, a first electrode 80 (e.g. n-side electrode; Cr/Ni/Au stack structure) serving as a bonding pad, with the first electrode 80 being electrically connected to the first semiconductor layer 30 for supplying electrodes thereto, and a second electrode 70 (e.g. p-side electrode; Cr/Ni/Au stack structure) serving as a bonding pad, with the second electrode 70 being electrically connected to the second semiconductor layer 50 for supplying holes thereto. Preferably, the growth substrate 10 has protruded and depressed portions 11, and a transparent current spreading electrode 60 (e.g. ITO) is usually provided almost across the entire surface of the second semiconductor layer 50 for current spreading between the second semiconductor layer 50 and the second electrode 70. This type of chip with the above structure is called a lateral chip, and wire bonding is laid for supplying power from outside to the first and second electrodes 80, 70. The first semiconductor layer 30 and the second semiconductor layer 50 each can have a plurality of layers. For example, the second semiconductor layer 50 may have an electron blocking layer with a high Al composition ratio adjacent to the active layer 40. Moreover, these two semiconductor layers can switch their conductivities with each other. The first semiconductor layer 30, the active layer 40 and the second semiconductor layer 50 constitute a so-called light emitting structure.

Figure 9:
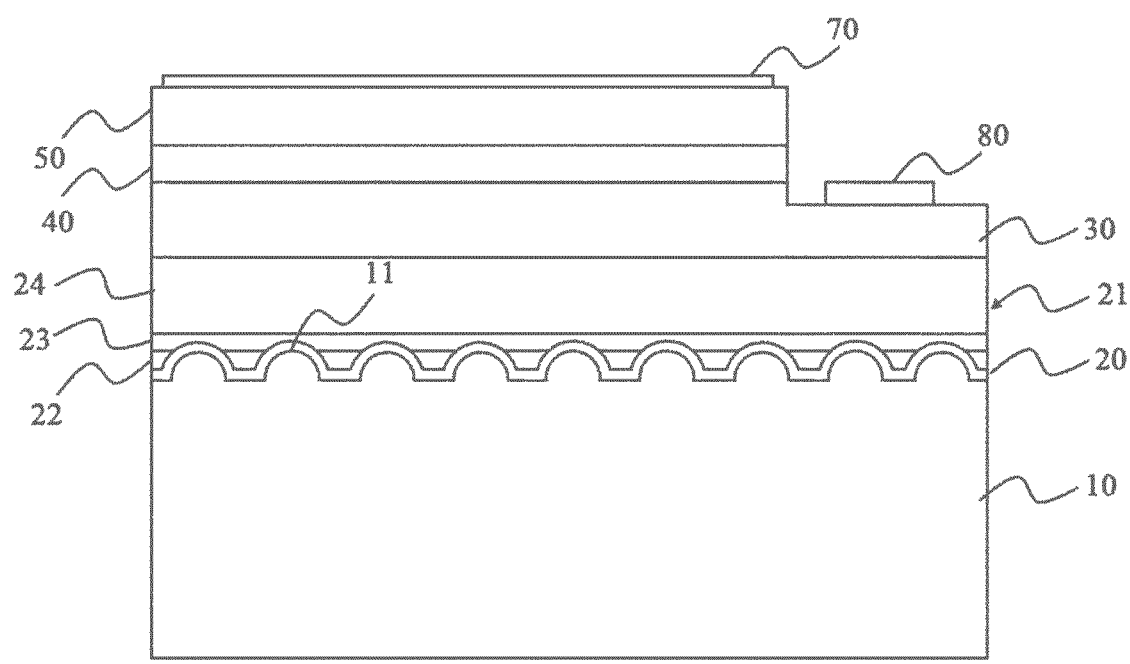
FIG. 9 illustrates another exemplary embodiment of a near-ultraviolet light emitting semiconductor device according to the present disclosure.

FIG. 9 illustrates another exemplary embodiment of a near-ultraviolet light emitting semiconductor device according to the present disclosure. Unlike the lateral chip described in FIG. 8, this device does not have the transparent current spreading electrode 60, and the second electrode 70 (e.g. Ag/Ni/Au or Al/Ni/Au) is formed almost across the entire surface of the second semiconductor layer 50. The second electrode 70 serves as a bonding pad as well as a reflective film for reflecting near-ultraviolet light generated from the active layer 40 towards the growth substrate 10. In an alternative embodiment, transparent current spreading electrode 60 may additionally be provided. In another alternative embodiment, the second electrode 70 may be designed to serve only as a bonding pad, and a DBR may be provided between the second electrode 70 and the second semiconductor layer 50. This type of a chip is called a flip chip.

Figure 10:
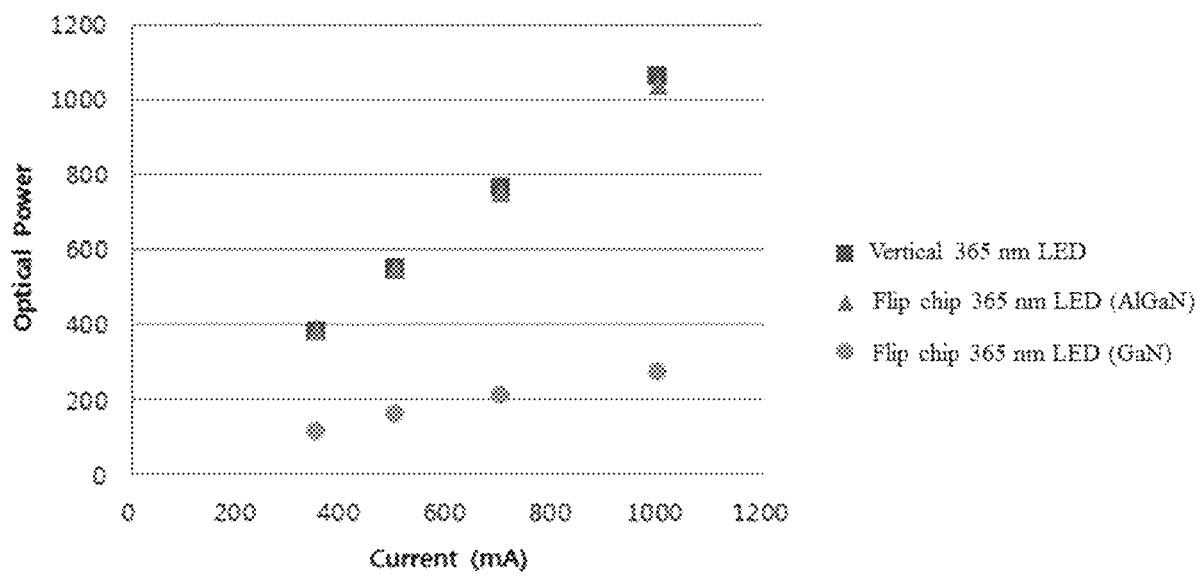
FIG. 10 shows test results of the near-ultraviolet light emitting semiconductor device of FIG. 9, using an integrating sphere.

FIG. 10 shows test results of the near-ultraviolet light emitting semiconductor device of FIG. 9, using an integrating sphere. The integration sphere test results reveal that the semiconductor light emitting device according to the present disclosure exhibits behavioral characteristics similar to those of commercially available vertical semiconductor light emitting devices that emit 365 nm wavelength light, and 3 to 4 times higher optical output than flip chips that include GaN at the lower portion.

The following describes various exemplary embodiments of the present disclosure.

(1) A Group III nitride semiconductor template for a 300-400 nm near-ultraviolet light emitting semiconductor device, the template comprising: a growth substrate; a nucleation layer based on $Al_xGa_{1-x}N$ ($0<x\leq 1$, $x>y$); and a monocrystalline Group III nitride semiconductor layer based on $Al_yGa_{1-y}N$ ($y>0$).

(2) The Group III nitride semiconductor template for a near-ultraviolet light emitting semiconductor device, wherein the growth substrate comprises protruded and depressed portions for scattering light, and the Group III nitride semiconductor layer is adapted to cover the protruded and depressed portions.

(3) The Group III nitride semiconductor template for a near-ultraviolet light emitting semiconductor device, wherein the Group III nitride semiconductor layer comprises a first layer growing from the nucleation layer, a second layer covering the first layer and being coalesced together from above, and a third layer flat on top of the second layer.

(4) The Group III nitride semiconductor template for a near-ultraviolet light emitting semiconductor device, wherein Al composition value x in the nucleation layer is larger than Al composition value y in the Group III nitride semiconductor layer in order to protect the nucleation layer from desorption at a growth temperature of the Group III nitride semiconductor layer.

(5) The Group III nitride semiconductor template for a near-ultraviolet light emitting semiconductor device, wherein the nucleation layer is AlN.

(6) A 300-400 nm near-ultraviolet light emitting semiconductor device, comprising: a growth substrate; a nucleation layer based on $Al_xGa_{1-x}N$ ($0<x\leq 1$, $x>y$); a monocrystalline Group III nitride semiconductor layer based on $Al_yGa_{1-y}N$ ($y>0$); a light emitting structure arranged above the Group III nitride semiconductor layer, for emitting near-ultraviolet light through electron-hole recombination; and a first and a second electrodes supplying electrons and holes to the light emitting structure, wherein Al composition value y in the Group III nitride semiconductor layer is determined, so as to prevent the Group III nitride semiconductor layer from absorbing the near-ultraviolet light emitted from the light emitting structure.

(7) The near-ultraviolet light emitting semiconductor device, wherein Al composition value x in the nucleation layer is larger than Al composition value y in the Group III nitride semiconductor layer.

(8) The near-ultraviolet light emitting semiconductor device, wherein the growth substrate comprises protruded and depressed portions for scattering the near-ultraviolet light emitted from the light emitting structure.

(9) The near-ultraviolet light emitting semiconductor device, wherein the Group III nitride semiconductor layer covers the protruded and depressed portions, and the Group III nitride semiconductor layer comprises a first layer growing from the nucleation layer, a second layer covering the first layer and being coalesced together from above, and a third layer flat on top of the second layer.

(10) The near-ultraviolet light emitting semiconductor device, wherein the nucleation layer is AlN.

Any of the near-ultraviolet light emitting semiconductor devices and any of the Group III nitride semiconductor templates used therefor according to the present disclosure can be suitable for obtaining commercially available near-ultraviolet light emitting semiconductor devices and Group III nitride semiconductor templates.

What is claimed is:

1. A 300-400 nm near-ultraviolet light emitting semiconductor device, comprising:
    a growth substrate;
    a nucleation layer based on $Al_xGa_{1-x}N$($0<x\leq 1$, $x>y$);
    a monocrystalline Group III nitride semiconductor layer based on $Al_yGa_{1-y}N$($y>0$) that does not include a dopant;
    a light emitting structure arranged above the Group III nitride semiconductor layer, for emitting near-ultraviolet light through electron-hole recombination; and
    first and second electrodes positioned to supply electrons and holes to the light emitting structure,
    wherein an Al composition value y in the Group III nitride semiconductor layer is specified to prevent the Group III nitride semiconductor layer from absorbing the near-ultraviolet light emitted from the light emitting structure,
    wherein the growth substrate is a sapphire substrate, and
    wherein the nucleation layer is formed directly on the growth substrate and the monocrystalline Group III nitride semiconductor layer is formed directly on the nucleation layer.

2. The near-ultraviolet light emitting semiconductor device according to claim 1, wherein an Al composition value x in the nucleation layer is larger than the Al composition value y in the Group III nitride semiconductor layer.

3. The near-ultraviolet light emitting semiconductor device according to claim 2, wherein the growth substrate comprises protruded and depressed portions for scattering the near-ultraviolet light emitted from the light emitting structure.

4. The near-ultraviolet light emitting semiconductor device according to claim 3, wherein the Group III nitride semiconductor layer covers the protruded and depressed portions, and the Group III nitride semiconductor layer comprises a first layer growing from the nucleation layer, a second layer covering the first layer and coalesced together from above, and a third layer positioned flat on top of the second layer.

5. The near-ultraviolet light emitting semiconductor device according to claim 4, wherein the nucleation layer is AlN.

* * * * *